(12) United States Patent
Takahashi (10) Patent No.: US 9,699,896 B2
(45) Date of Patent: Jul. 4, 2017

(54) SUBSTRATE AND ELECTRONIC DEVICE (71) Applicant: SEIKO EPSON CORPORATION, Tokyo (JP)

(72) Inventor: Hideki Takahashi, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/792,878

(22) Filed: Jul. 7, 2015

(65) Prior Publication Data

US 2016/0037628 A1 Feb. 4, 2016

(30) Foreign Application Priority Data

Aug. 1, 2014 (JP) .................................. 2014-158082

(51) Int. Cl.
*H05K 1/02* (2006.01)
*H05K 1/11* (2006.01)
*H05K 1/18* (2006.01)

(52) U.S. Cl.
CPC ............ *H05K 1/029* (2013.01); *H05K 1/0296* (2013.01); *H05K 1/11* (2013.01); *H05K 1/184* (2013.01); *H05K 1/0286* (2013.01); *H05K 1/181* (2013.01); *H05K 2201/093* (2013.01); *H05K 2203/175* (2013.01)

(58) Field of Classification Search
CPC ............. H05K 1/029; H05K 2203/175; H05K 2201/093; H05K 1/0254; H05K 1/0286; H05K 1/0287; H05K 1/0289; H05K 1/0292; H05K 1/0293; H05K 1/0296; H05K 1/14; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0256; H05K 1/0257; H05K 1/0259; H05K 1/026; H05K 1/0263; H05K 1/0265; H05K 1/0278; H05K 1/0284; H05K 1/0298; H05K 1/036; H05K 1/0366; H05K 1/0373;

(Continued)

(56) References Cited

U.S. PATENT DOCUMENTS

| | | | | | |
|---|---|---|---|---|---|
| 3,033,914 | A | * | 5/1962 | Acosta-Lleras | ...... H05K 1/0287 174/254 |
| 3,621,116 | A | * | 11/1971 | Adams | ................. H05K 1/0287 174/254 |
| 3,880,610 | A | * | 4/1975 | Long | ...................... H05K 1/029 174/254 |

FOREIGN PATENT DOCUMENTS

JP 2013-240199 A 11/2013

* cited by examiner

*Primary Examiner* — Ishwarbhai B Patel
(74) *Attorney, Agent, or Firm* — Global IP Counselors, LLP

(57) ABSTRACT

A substrate includes a first pattern on which terminals are formed; a second pattern on which terminals are formed; and a third pattern on which terminals are formed. A distance between a first pair of terminals which are configured by one terminal of the first pattern and one terminal of the second pattern is equal to a distance between a second pair of terminals which are configured by another terminal of the first pattern and one terminal of the third pattern, and a distance between a third pair of terminals which are configured by another of the terminals of the third pattern and another of the terminals of the second pattern is equal to a distance between a fourth pair of terminals which are configured by the other of the terminal of the third pattern and the other of the terminal of the first pattern.

8 Claims, 9 Drawing Sheets

(58) Field of Classification Search
CPC .......... H05K 1/0393; H05K 1/05; H05K 1/11; H05K 1/111; H05K 1/181; H02M 3/00
See application file for complete search history.

| PAIR | HOLE |
|---|---|
| P1 | 221 |
|  | 231 |
| P2 | 221 |
|  | 241 |
| P3 | 232 |
|  | 242 |
| P4 | 223 |
|  | 242 |

FIG. 9

SUBSTRATE AND ELECTRONIC DEVICE

CROSS REFERENCES TO RELATED APPLICATIONS

The entire disclosure of Japanese Patent Application No. 2014-158082, filed Aug. 1, 2014 is incorporated by reference herein.

BACKGROUND

1. Technical Field

The present invention relates to a substrate that enables a proper use of a series circuit and a parallel circuit by changing a form of mounting an electronic component.

2. Related Art

A printed substrate has been used so as to form a circuit by mounting an electronic component. The printed substrate has a pattern formed of a conductive material which allows a current to flow, and a hole into which a lead for an electronic component which is formed on the pattern is inserted. In the printed substrate, a lead for the electronic component is inserted into the hole and electrically links patterns to each other, and thereby a circuit can be formed on the printed substrate.

For example, there is a case where a power supply circuit is formed by using the printed substrate. The power supply circuit is a circuit of generating power in the power supply circuit (for example, see JP A-2013-240199). It is necessary that the power supply circuit constitutes a circuit that can correspond to specifications in circumstances of using the power supply circuit, such as a breakdown voltage demand. For example, since a voltage value of supplied power is changed in accordance with a destination of a product, it is required to set characteristics of the power supply circuit for each destination.

An example of a method of changing the characteristics of the power supply circuit is that a connection of the same type of electronic components to each other is changed between a series connection and a parallel connection and is properly used. Such a method in which a connection of the same type of an electronic component is changed between a series connection and a parallel connection and is properly used is not limited to the power supply circuit. However, changing of a connection of an electronic component requires changing of a pattern of the printed substrate. For this reason, a proper use of different printed substrates in accordance with specifications of a product is necessary. The proper use of printed substrates in accordance with specifications causes cost of a product or a degree of management of a component to be increased, and thereby is not desired.

SUMMARY

An advantage of some aspects of the invention is to provide a substrate which is allowed to correspond to different specifications only by changing a connection of an electronic component, and an electronic device which uses the substrate.

According to an aspect of the invention, there is provided a substrate including: a first pattern which corresponds to wiring on which terminals are formed; a second pattern which corresponds to wiring on which terminals are formed; and a third pattern which corresponds to wiring on which terminals are formed, in which a distance between a first pair of terminals which are configured by one terminal of the first pattern and one terminal of the second pattern is equal to a distance between a second pair of terminals which are configured by another terminal of the first pattern and one terminal of the third pattern, and a distance between a third pair of terminals which are configured by another of the terminals of the third pattern and another of the terminals of the second pattern is equal to a distance between a fourth pair of terminals which are configured by the other of the terminal of the third pattern and the other of the terminal of the first pattern.

The terminal means a hole in a through-hole mounting method in which a hole is formed on a pattern, or means a land in a surface mounting method in which a land is formed on a pattern. A distance between the terminals means a length of a line segment configured by linking terminals which form a pair to each other, that is, means a pitch.

In this application, meaning of distances being equal to each other includes a case where the lengths of line segments are different in a range of allowing the same electronic component to be mounted in addition to a case where lengths of line segments are strictly equal to each other.

An electronic component may be a component such as a capacitor, a resistor, and a coil as long as it is possible to switch a series connection and a parallel connection for two components or more.

In an embodiment having the above configuration, one electronic component is mounted by using a first pair of terminals and another electronic component is mounted by using the third pair of terminals when the two electronic components are connected in series. That is, the two electronic components are connected in series between the third pattern and the first pattern with the second pattern performing relaying. When the two electronic components are connected in parallel, one electronic component is mounted by using the second pair of terminals and another electronic component is mounted by using the fourth pair of terminals. That is, the two electronic components are connected in parallel between the third pattern and the first pattern. A distance between the first pair of terminals, a distance between the second pair of terminals, a distance between the third pair of terminals, and a distance between the fourth pair of terminals are equal to each other. Thus, distances (pitches) between terminals on the patterns to which terminals of electronic components are connected are equal to each other when the electronic components are connected in series and when the electronic components are connected in parallel. For this reason, it is possible to properly use a series connection and a parallel connection by using one printed substrate, as a form of mounting two electronic components of the same type. Further, it is possible to produce power supply circuits corresponding to different specifications by using the same printed substrate.

In this application, meaning of being in parallel includes a case where lines are not parallel in a range of allowing a person to perceive the lines being parallel when the person sees the lines, in addition to a case of being strictly in parallel. In this application, a middle point includes a middle point which allows a little variation or error in addition to a middle point in a strict sense.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments according to the invention will be described in the following order.
1. First Embodiment
(1) Configuration of Electronic Device
(2) Configuration of Power Supply Substrate
2. Second Embodiment
3. Third Embodiment
4. Fourth Embodiment
5. Fifth Embodiment
6. Other embodiments

1. First Embodiment (1) Configuration of Electronic Device

Figure 1:
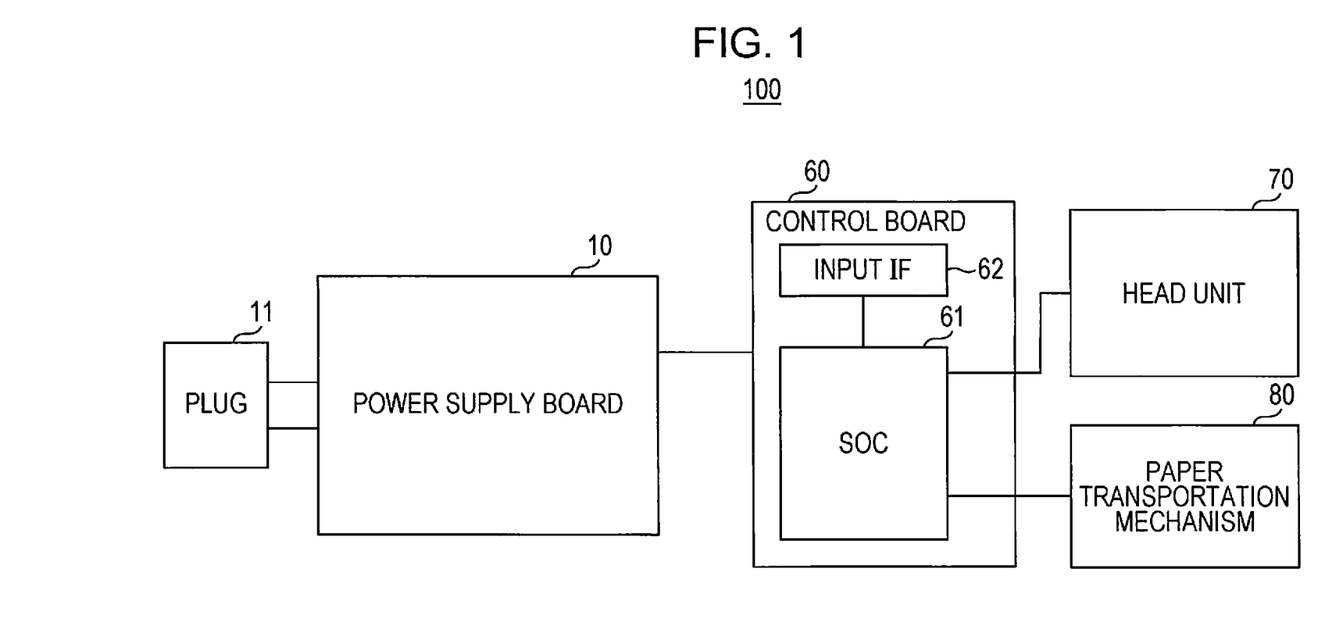
FIG. 1 is a block diagram illustrating a configuration of an electronic device as an example.

FIG. 1 is a block diagram illustrating a configuration of an electronic device as an example.

FIG. 1 illustrates a printer 100 as an example of an electronic device. The printer 100 includes a power supply substrate 10 which functions as a power supply circuit, a control substrate 60 which functions as a control circuit, a head unit 70, and a paper transportation mechanism 80. The head unit 70 and the paper transportation mechanism 80 are connected to the control substrate 60 and operations of the head unit 70 and the paper transportation mechanism 80 are controlled by the control substrate 60. An example in which the printer 100 is an ink jet type will be described, but the printer may be the other type printer such as a laser printer and a sublimation printer.

For example, the power supply substrate 10 is a switching type power supply circuit and generates a direct current (DC) power from an alternating current (AC) power which is input through a plug 11. The power supply substrate 10 includes a rectifier circuit, a power transformer, a switching circuit, and an oscillation control circuit which are not illustrated in FIG. 1. A specific configuration of the power supply substrate 10 will be described later.

A DC power which is generated by the power supply substrate 10 is supplied to the control substrate 60. The control substrate 60 controls driving of the head unit 70 or the paper transportation mechanism 80 with electricity (power) which is supplied from the power supply substrate 10.

The control substrate 60 illustrated in FIG. 1 includes a system-on-the-chip (SOC) 61 and an input IF 62. The SOC 61 generally controls driving of the printer 100 and the input IF 62 inputs printing data which is supplied from an external device such as a PC, to the SOC 61. The SOC 61 includes a CPU, a ROM, and a RAM. In the SOC 61, the CPU develops a program which is recorded in the ROM into the RAM and executes the developed program, and thus a function for controlling the head unit 70 or the paper transportation mechanism 80 is performed.

The head unit 70 records a recording material on paper under control of the control substrate 60.

The head unit 70 performs recording of an ink on paper by discharging an ink which is supplied from a cartridge from a tip end of a nozzle. The head unit 70 includes a piezoelectric print head or a bubble jet print head, for example. In the piezoelectric print head, driving of a piezoelectric element causes an ink to be discharged. In the bubble jet print head, heating of a heater causes an ink to be discharged.

When the printer 100 is a serial printer, a print head is caused to perform a reciprocating movement in a direction of intersecting with a transportation direction of paper, and thereby a recording material is recorded on the paper.

When the printer 100 is a line printer, a print head is fixed, and a recording material is recorded on paper with transporting of the paper.

In the paper transportation mechanism 80, paper which is set in a tray or a cassette (not illustrated) is transported along a transportation path in the printer 100.

The paper transportation mechanism 80 may be a transportation roller or a transportation belt for transporting paper.

(2) Configuration of Power Supply Substrate

Next, a specific configuration of the power supply substrate 10 will be described.

Figure 2A:
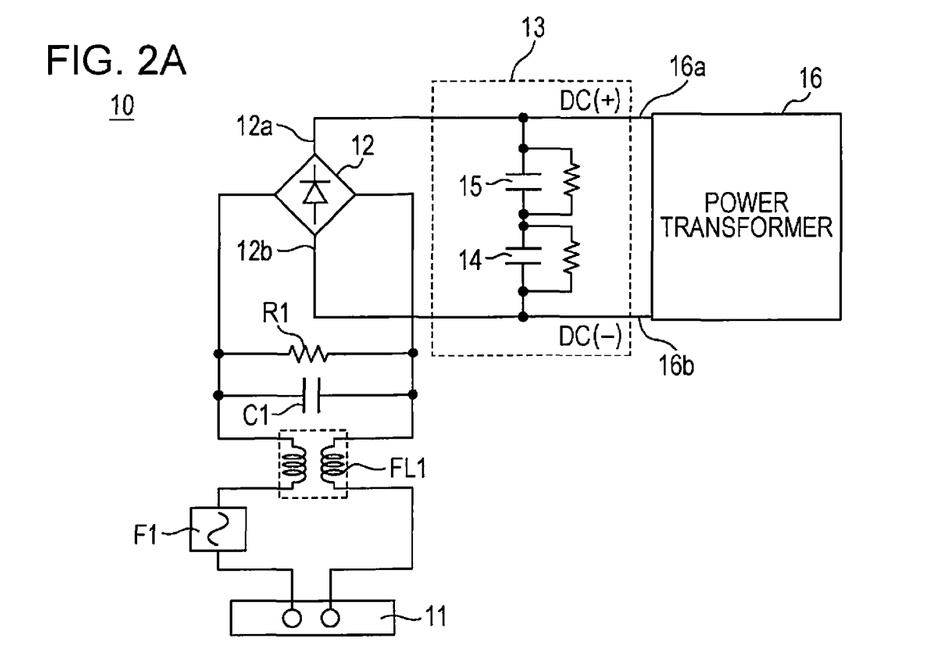
FIGS. 2A and 2B are circuit diagrams illustrating a portion of a power supply substrate.
Figure 2B:
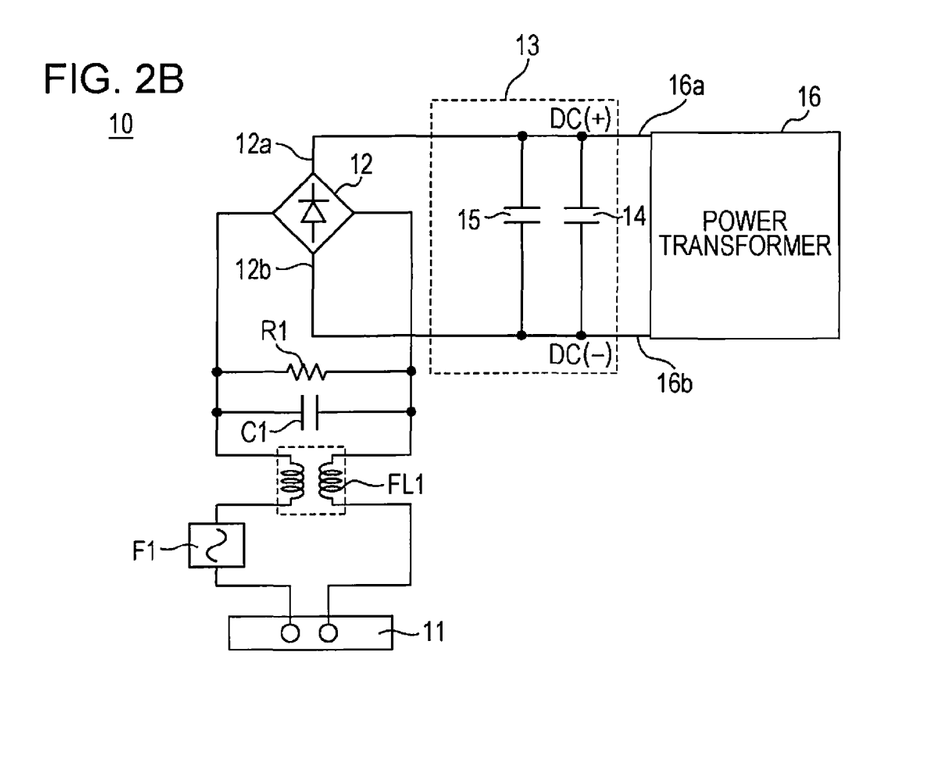

FIGS. 2A and 2B are circuit diagrams illustrating a portion of a power supply substrate 10. FIG. 2A illustrates a circuit diagram when a capacity of the power supply substrate 10 becomes smaller and a breakdown voltage thereof becomes higher. FIG. 2B illustrates a circuit diagram when a breakdown voltage of the power supply substrate 10 becomes smaller and a capacity thereof becomes higher.

In the power supply substrate 10 illustrated in FIG. 2, a line filter FL1 is connected to an output side of the plug 11. The line filter FL1 cuts off a high frequency component of an AC power which is input from the plug 11. A fuse F1 functions as an element for protecting the power supply substrate 10 and is connected between the plug 11 and the line filter FL1.

A rectifier circuit 12 is connected to an output side of the line filter FL1 through a capacitor C1 and a resistor R1. The rectifier circuit 12 may be a diode bridge circuit, for example. The rectifier circuit 12 rectifies and converts an alternating power into a DC power.

A breakdown voltage setting circuit 13 sets a breakdown voltage of the power supply substrate 10 and is connected to an output side of the rectifier circuit 12. The breakdown voltage setting circuit 13 includes capacitors 14 and 15, and sets the breakdown voltage of the power supply substrate 10 by using a combination of capacitances of the capacitors 14 and 15. The capacitors 14 and 15 are electrolytic capacitors and are connected between a pattern in which a positive voltage flows and a pattern in which a negative voltage flows.

The switching circuit and the oscillation control circuit (not illustrated), and the power transformer 16 are connected to an output side of the breakdown voltage setting circuit 13.

As illustrated in FIG. 2A, when the capacitors 14 and 15 are connected in series, the combination Co of capacitances in the breakdown voltage setting circuit 13 has a value obtained by using the following Expression (1).

$$Co = C14*C15/(C14+C15) \tag{1}$$

Here, Co indicates the combination of capacitances of the capacitors 14 and 15. C14 indicates capacitance of the capacitor C14 and C15 indicates capacitance of the capacitor C15.

As illustrated in FIG. 2B, when the capacitors 14 and 15 are connected in parallel, the combination Co of capacitances in the breakdown voltage setting circuit 13 has a value obtained by using the following Expression (2).

$$Co = C14+C15 \tag{2}$$

As the combination Co of capacitances becomes smaller, a breakdown voltage (V) of the capacitors becomes higher. As the combination Co of capacitances becomes larger, a breakdown voltage (V) of the capacitors becomes lower. For this reason, the capacitors 14 and 15 are properly connected in series (FIG. 2A) or in parallel (FIG. 2B), and thus it is possible to change the breakdown voltage of the power supply substrate 10.

Figure 3:
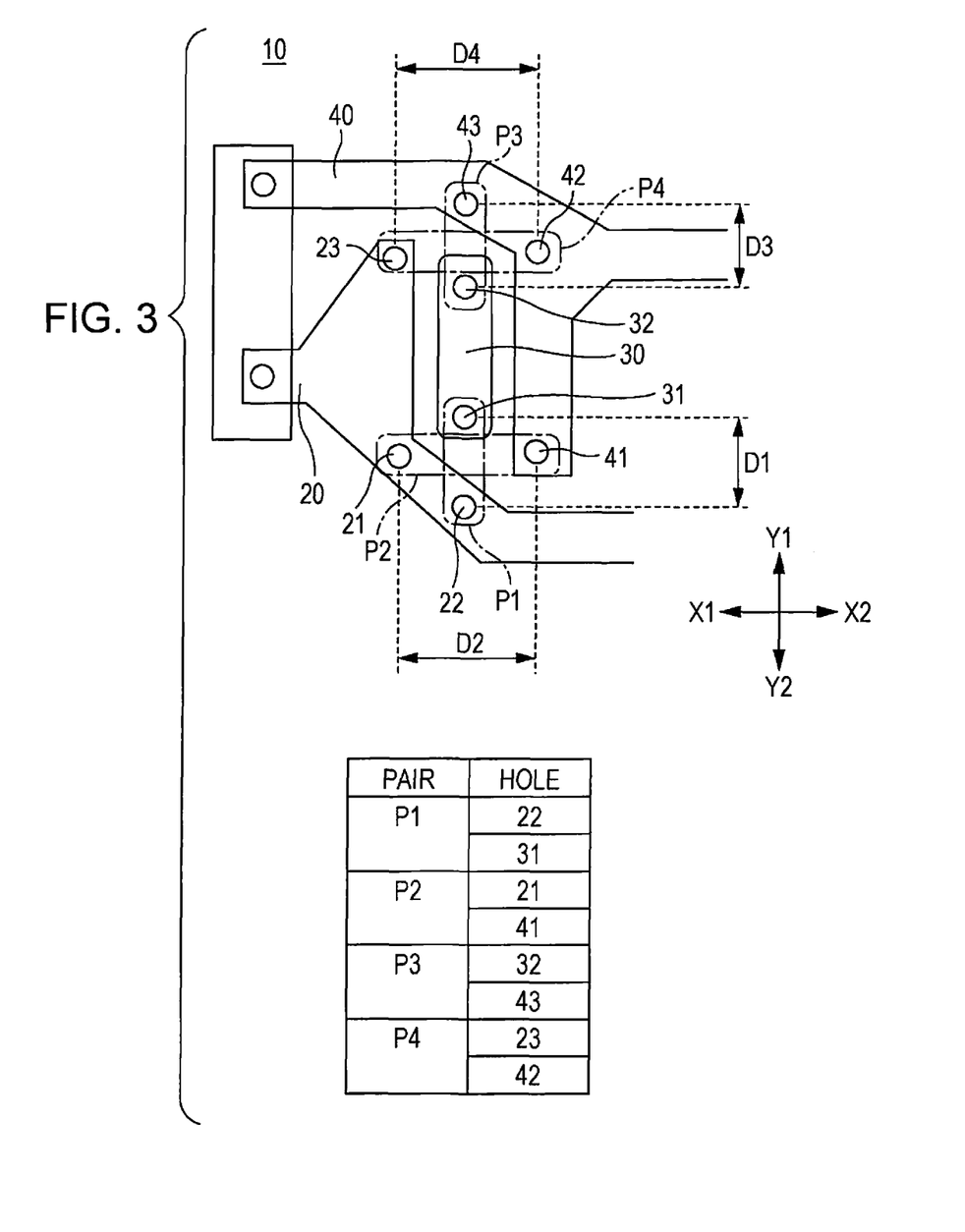
FIG. 3 is a diagram illustrating patterns of the power supply substrate (breakdown voltage setting circuit).

FIG. 3 is a diagram illustrating patterns of the power supply substrate 10 (breakdown voltage setting circuit 13). FIG. 3 illustrates a so-called barebones state, that is, the power supply substrate 10 before an electronic component (capacitor, power transformer, and the like) is mounted. In the power supply substrate illustrated as an example in FIG. 3, an electronic component is mounted by a through-hole mounting method.

In FIG. 3, a first pattern 20, a second pattern 30, and a third pattern 40 which constitute a portion of the breakdown voltage setting circuit 13 are formed on a component placement surface of the power supply substrate 10. Each of the patterns 20, 30, and 40 is formed in such a manner that a conductive material such as a copper foil is stacked on an insulating material which is a base of the power supply substrate 10 and then a result of being stacked is processed by performing etching or the like.

In the following descriptions, a direction from an input side of the breakdown voltage setting circuit 13 (rectifier circuit 12 side) to an output side of the breakdown voltage setting circuit 13 (power transformer 16 side) is also described as an X direction, and a direction which intersects with the X direction on the component placement surface of the power supply substrate 10 is also described as a Y direction. In the X direction, the input side of the breakdown voltage setting circuit 13 is described as an X1 side and the output side thereof is described as an X2. In the Y direction, the third pattern 40 side is described as an Y1 side and the first pattern 20 side is described as an Y2 side. In the breakdown voltage setting circuit 13, the rectifier circuit 12 side is also described as the input side and the power transformer 16 side is also described as the output side.

The first pattern 20 performs an electrical connection of a negative output terminal 12b of the rectifier circuit 12 and a negative input terminal 16b of the power transformer 16. In FIG. 3, the first pattern 20 is extended from the input side (X1) to the output side (X2). The input side of the first pattern 20 (X1 side) is extended to the third pattern 40 side (Y1 side) and a tip end of the first pattern 20 is formed at a position which is near the third pattern 40.

Holes 21, 22, and 23 for extracting a negative voltage are formed on the first pattern 20. In FIG. 3, the hole 23 is formed on the third pattern 40 side (Y1 side) of an input side (X1 side) of the first pattern 20, and the holes 21 and 22 are formed at positions which are separated on an opposite side (Y2 side) of the hole 23.

The second pattern 30 is a pattern which is connected to neither the rectifier circuit 12 and the power transformer 16. Holes 31 and 32 are formed on the second pattern 30. The holes 31 and 32 on the second pattern 30 enables extraction of a potential which is an intermediate potential of a voltage on a positive side of the breakdown voltage setting circuit 13 and a voltage on a negative side of the breakdown voltage setting circuit 13. In FIG. 3, the second pattern 30 is disposed between the third pattern 40 and the first pattern 20 and is extended from the third pattern side (Y1 side) over the first pattern side (Y2 side) in the Y direction. The hole 31 is formed on the first pattern side (Y2 side) of the second pattern 30. The hole 32 is formed on the third pattern side (Y1 side) of the second pattern 30.

The third pattern 40 performs an electrical connection of a positive output terminal 12a of the rectifier circuit 12 and a positive input terminal 16a of the power transformer 16. In FIG. 3, the third pattern 40 is extended from the input side (X1) to the output side (X2). An output side (X2 side) of the third pattern 40 is extended to the first pattern 20 side (Y2 side) and a tip end of the third pattern 20 on the output side thereof is formed at a position which is near the first pattern 20.

Holes 41, 42, and 43 for extracting a positive voltage are formed on the third pattern 40. In FIG. 3, the hole 41 is formed on the first pattern 20 side (Y2 side) of the output side (X2 side) of the third pattern 40, and the holes 42 and 43 are formed at positions which are separated on an opposite side (Y1 side) of the hole 41.

In the power supply substrate 10, groups of holes which are used when the capacitors 14 and 15 are connected in series or in parallel are distinguished from each other by using a first pair P1 to a fourth pair P4. The first pair P1 and a third pair P3 are pairs of holes which are used when the capacitors 14 and 15 are connected in series (FIG. 2A). A second pair P2 and the fourth pair P4 are pairs of holes which are used when the capacitors 14 and 15 are connected in parallel (FIG. 2B).

In FIG. 3, the first pair P1 is configured by the hole 22 of the first pattern. 20 and the hole 31 of the second pattern 30. The second pair P2 is configured by the hole 21 of the first pattern 20 and the hole 41 of the third pattern 40. The third pair P3 is configured by the hole 43 of the third pattern 40 and the hole 32 of the second pattern 30. The fourth pair P4 is configured by the hole 42 of the third pattern 40 and the hole 23 of the first pattern 20.

A lead of the capacitor 14 is inserted into the first pair P1 of the holes 22 and 31, and a lead of the capacitor 15 is inserted into the third pair P3 of the holes 32 and 43. Thus, the capacitors 14 and 15 are connected in series.

The lead of the capacitor 14 is inserted into the second pair P2 of the holes 21 and 41, and the lead of the capacitor 15 is inserted into the fourth pair P4 of the holes 23 and 42. Thus, the capacitors 14 and 15 are connected in parallel.

As illustrated in FIG. 3, a distance D1 and a distance D2 are equal to each other. The distance D1 is a distance of a line segment which links the first pair P1 of the holes 22 and 31 to each other (that is, a distance between the first pair P1 of holes). The distance D2 is a distance of a line segment which links the second pair P2 of the holes 21 and 41 to each other (that is, a distance between the second pair P2 of holes or simply also described as a distance D). In addition, a distance D3 and a distance D4 are equal to each other. The distance D3 is a distance of a line segment which links the third pair P3 of the holes 32 and 43 to each other (that is, distance between the third pair P3 of holes). The distance D4 is a distance of a line segment which links the fourth pair P4 of the holes 23 and 42 to each other (that is, distance between the fourth pair P4 of holes). Here, being equal to each other includes a variation or an error in a range of enabling the capacitors 14 and 15 to be inserted in addition to a case where the two distances are strictly equal to each other.

The distances D1 and D2 are set by using a distance corresponding to a pitch between the lead of the capacitor 14 and the lead of the capacitor 15. The distances D3 and D4 are also set by using a distance corresponding to a pitch between the leads of the capacitors 14 and 15.

In the first embodiment, the distances D1, D2, D3, and D4 are the same distance.

Figure 4A:
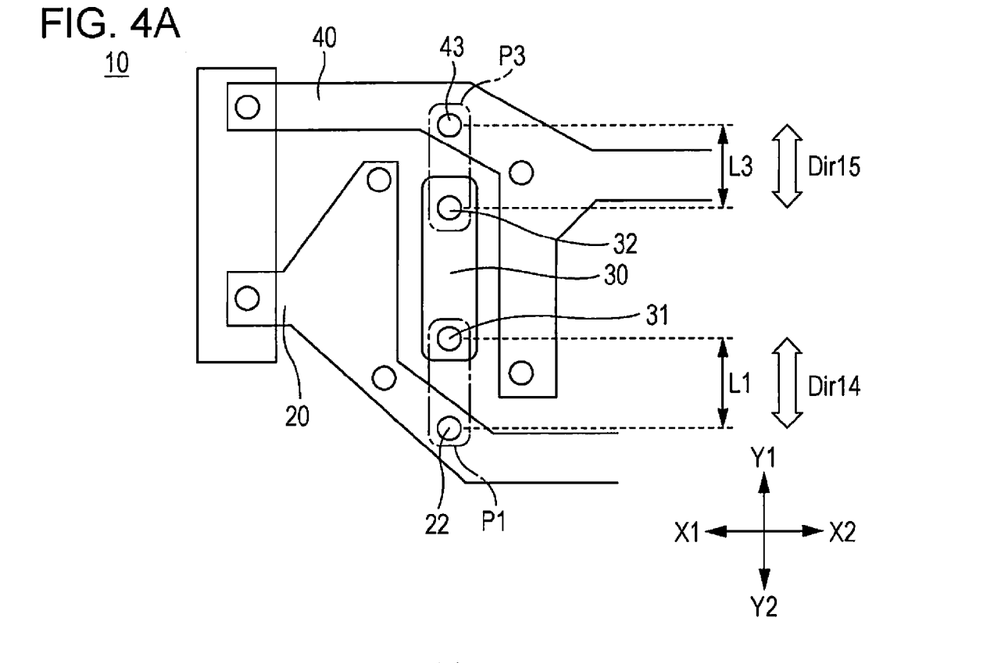
FIG. 4A is a diagram illustrating orientations of capacitors when a series connection is performed.
Figure 4B:
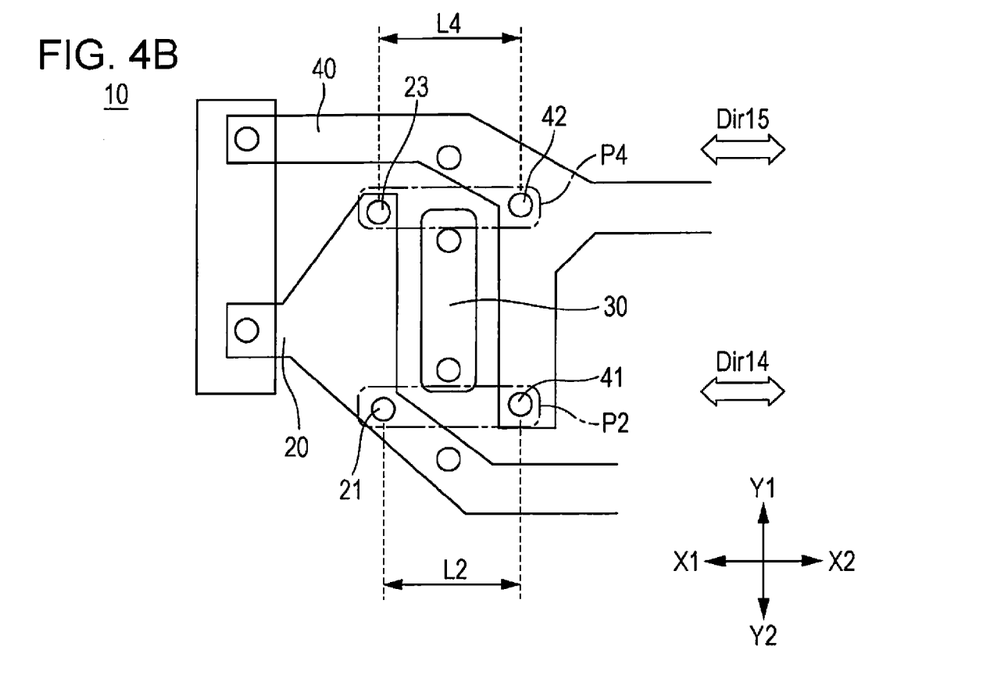
FIG. 4B is a diagram illustrating the orientations of the capacitors when a parallel connection is performed.

FIG. 4 is a diagram illustrating orientations of the capacitors 14 and 15 when the capacitors 14 and 15 are connected in series, and the orientations of the capacitors 14 and 15 when the capacitors 14 and 15 are connected in parallel.

FIG. 4A illustrates the orientations of capacitors 14 and 15 when the capacitors 14 and 15 are connected in series. FIG. 4B illustrates the orientations of the capacitors 14 and 15 when the capacitors 14 and 15 are connected in parallel. In FIG. 4A, a line segment which links the first pair P1 of holes 22 and 31 to each other is indicated by L1, and a line segment which links the third pair P3 of holes 32 and 43 to each other is indicated by L3.

In FIG. 4B, a line segment which links the second pair P2 of holes 21 and 41 to each other is indicated by L2, and a line segment which links the fourth pair P4 of holes 23 and 43 to each other is indicated by L4.

The orientation of the capacitor is defined in accordance with an orientation of the line segment which links the leads to each other. As an example, in FIGS. 4A and 4B, a direction in which the line segment linking the leads is extended is set as an orientation Dir of the capacitor. Dir14 corresponds to the orientation of the capacitor 14 and Dir15 corresponds to the orientation of the capacitor 15.

In the power supply substrate 10, positions of the first pair P1 of holes 22 and 31 and positions of the third pair P3 of holes 32 and 43 are defined such that the line segment L1 and the line segment L3 are parallel with each other. For this reason, as illustrated in FIG. 4A, the capacitors 14 and 15 are connected in series by using the first pair P1 of holes 22 and 31 and the third pair P3 of holes 32 and 43, and thus the orientation of the capacitor 14 is the same as the orientation of the capacitor 15.

In the power supply substrate 10, positions of the second pair P2 of holes 21 and 41 and positions of the fourth pair P4 of holes 23 and 42 are defined such that the line segment L2 and the line segment L4 are parallel with each other. For this reason, as illustrated in FIG. 4B, the capacitors 14 and 15 are connected in parallel by using the second pair P2 of holes 21 and 41 and the fourth pair P4 of holes 23 and 42, and thus the orientation of the capacitor 14 is the same as the orientation of the capacitor 15.

As illustrated in FIGS. 4A and 4B, the line segment L1 and the line segment L2 are not parallel with each other (in FIGS. 4A and 4B, orthogonal to each other). The orientations of the capacitors 14 and 15 when the capacitors 14 and 15 are connected in series are not the same as the orientations of the capacitors 14 and 15 when the capacitors 14 and 15 are connected in parallel. Generally, a product number or a design of a capacitor is printed at the same position on the capacitor. Thus, if orientations of capacitors are different from each other, the product number or the design is not arranged with the same orientation. For this reason, if the orientations of the capacitors when a series connection is performed are different from the orientations of the capacitors when a parallel connection is performed, it can be determined whether a series connection has been performed or whether a parallel connection has been performed, based on the orientations of the capacitors 14 and 15 in a check after assembly.

Figure 5:
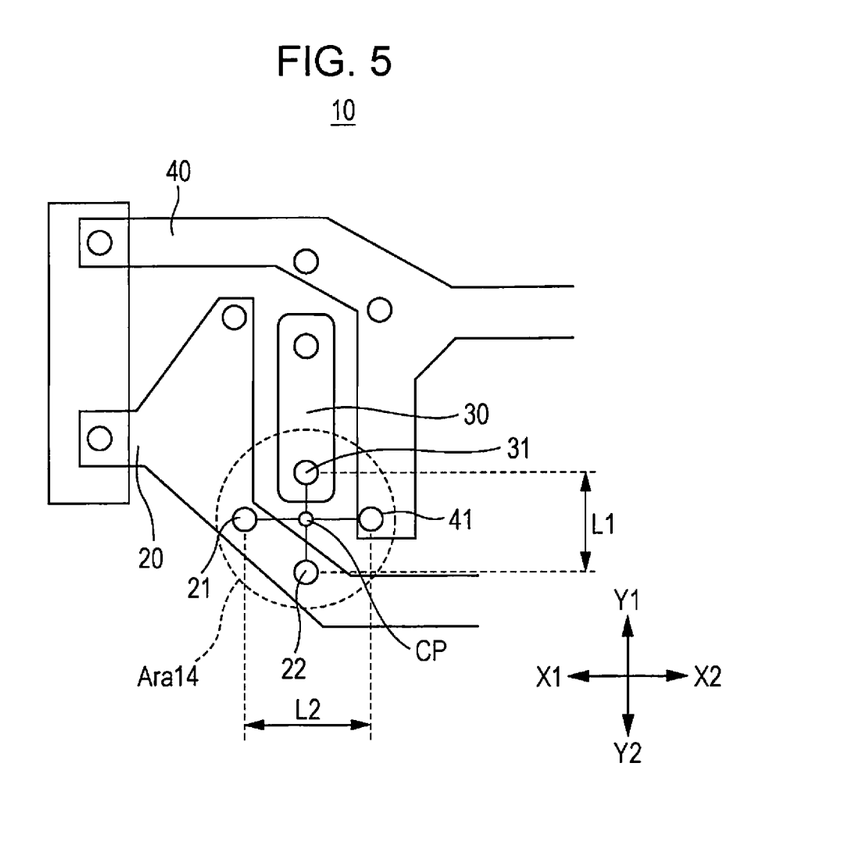
FIG. 5 is a diagram illustrating a relationship of a line which links holes of a first pair to each other, and a line which links holes of a second pair to each other.

FIG. 5 is a diagram illustrating a relationship of the line segment L1 which links the first pair P1 of holes and the line segment L2 which links the second pair of holes. Ara14 indicates a position at which the capacitor 14 is disposed in the power supply substrate 10.

As illustrated in FIG. 5, each of the holes 21, 22, 31, and 41 is disposed at positions which causes a point CP to be a middle point of the line segment L1 and a middle point of the line segment L2. The point CP is obtained by the line segment L1 (which links the first pair P1 of holes 22 and 31) intersecting with the line segment L2 (which links the second pair of holes 21 and 41). For this reason, the position (Ara14) of the capacitor 14 when the capacitor 14 and the capacitor 15 are connected in series is the same on the power supply substrate 10 as the position of the capacitor 14 when the capacitor 14 is connected in parallel with the capacitor 15.

Each of the holes 23, 32, 42, and 43 is disposed at positions which causes a point (not illustrated in FIG. 5) to be a middle point of the line segment L3 and a middle point of the line segment L4. The point is obtained by the line segment L3 (which links the third pair P3 of holes 32 and 43) intersecting with the line segment L4 (which links the fourth pair P4 of holes 23 and 42). Thus, the position of the capacitor 15 when the capacitor 15 and the capacitor 14 are connected in series is the same on the power supply substrate 10 as the position of the capacitor 15 when the capacitor 15 is connected in parallel with the capacitor 14.

In the above-described first embodiment, it is possible to properly use a series connection and a parallel connection by using one power supply substrate (printed substrate) as a form of mounting two electronic components of the same type. Further, it is possible to produce power supply circuits corresponding to different specifications by using the same printed substrate.

2. Second Embodiment

A second embodiment is different from the first embodiment from a viewpoint of positions of holes which form a pair.

Figure 6:
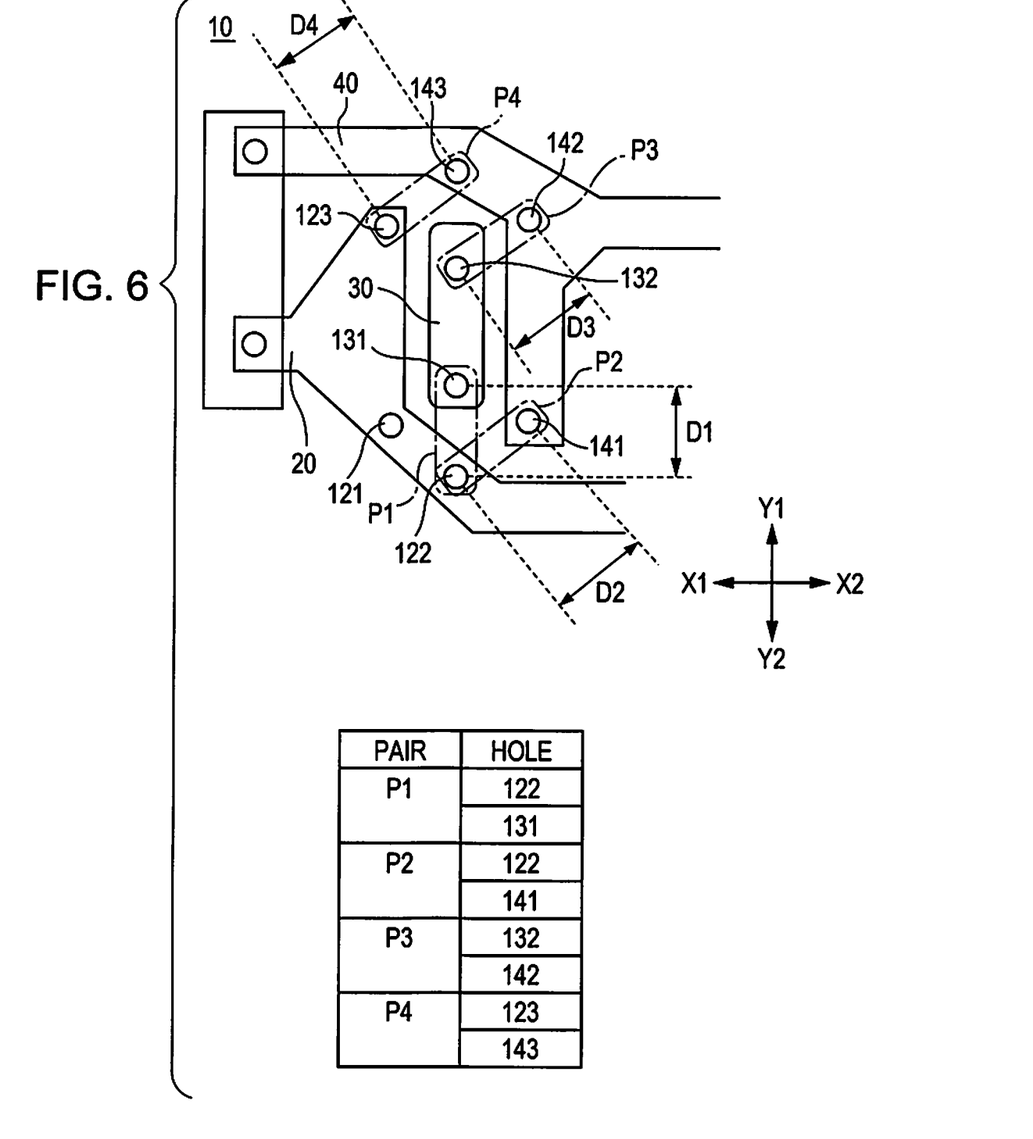
FIG. 6 is a diagram illustrating patterns of a power supply substrate (breakdown voltage setting circuit) according to a second embodiment.

FIG. 6 is a diagram illustrating patterns of a power supply substrate 10 (breakdown voltage setting circuit 13) according to the second embodiment. FIG. 6 illustrates a so-called barebones state, that is, a state where electronic components have been removed from the power supply substrate 10. In FIG. 6, a first pattern 20, a second pattern 30, and a third pattern 40 which constitute a portion of the breakdown voltage setting circuit 13 are formed on a component placement surface of the power supply substrate 10.

Holes 121, 122, and 123 for extracting a negative voltage are formed on the first pattern 20. In FIG. 6, the hole 123 is formed on the third pattern 40 side (Y1 side) of an input side (X1 side) of the first pattern 20, and the holes 121 and 122 are formed at positions which are separated on an opposite side (Y2 side) of the hole 123.

Holes 131 and 132 are formed on the second pattern 30. In FIG. 6, the hole 131 of the second pattern 30 is formed on the first pattern side (Y2 side) of the second pattern 30. The hole 132 is formed on the third pattern side (Y1 side) of the second pattern 30.

Holes 141, 142, and 143 for extracting a positive voltage are formed on the third pattern 40. In FIG. 6, the hole 141 is formed on the first pattern 20 side (Y2 side) of the output side (X2 side) of the third pattern 40, and the holes 142 and 143 are formed at positions which are separated on an opposite side (Y1 side) of the hole 141.

In the second embodiment, a first pair P1 and a third pair P3 are also pairs of holes which are used when the capacitors 14 and 15 are connected in series. A second pair P2 and a fourth pair P4 are pairs of holes which are used when the capacitors 14 and 15 are connected in parallel.

A distance D1 between the first pair P1 of holes is equal to a distance D2 between the second pair P2 of holes. A distance D3 between the third pair P3 of holes is equal to a distance D4 between the fourth pair P4 of holes. For this reason, at least a portion of the capacitors 14 and 15 are in the same position on the power supply substrate 10 when the capacitors 14 and 15 are mounted by inserting leads of the capacitors 14 and 15 into the first pair P1 of holes and when the capacitors 14 and 15 are mounted by inserting leads of the capacitors 14 and 15 into the second pair P2 of holes.

However, in FIG. 6, the first pair P1 is configured by the hole 122 of the first pattern 20 and the hole 131 of the second pattern 30. The third pair P3 is configured by the hole 142 of the third pattern 40 and the hole 132 of the second pattern 30. The second pair P2 is configured by the hole 122 of the first pattern 20 and the hole 141 of the third pattern 40. The fourth pair P4 is configured by the hole 143 of the third pattern 40 and the hole 123 of the first pattern 20.

That is, positions of holes which form each of the pairs are different from those in the first embodiment.

In the above-described second embodiment, only positions of electronic components are slightly moved when the electronic components are connected in series and when electronic components are connected in parallel, and thereby it is possible to produce power supply circuits corresponding to different specifications by using the same printed substrate.

3. Third Embodiment

A third embodiment is different from the first embodiment in that there is a pair which has a common hole among pairs.

Figure 7:
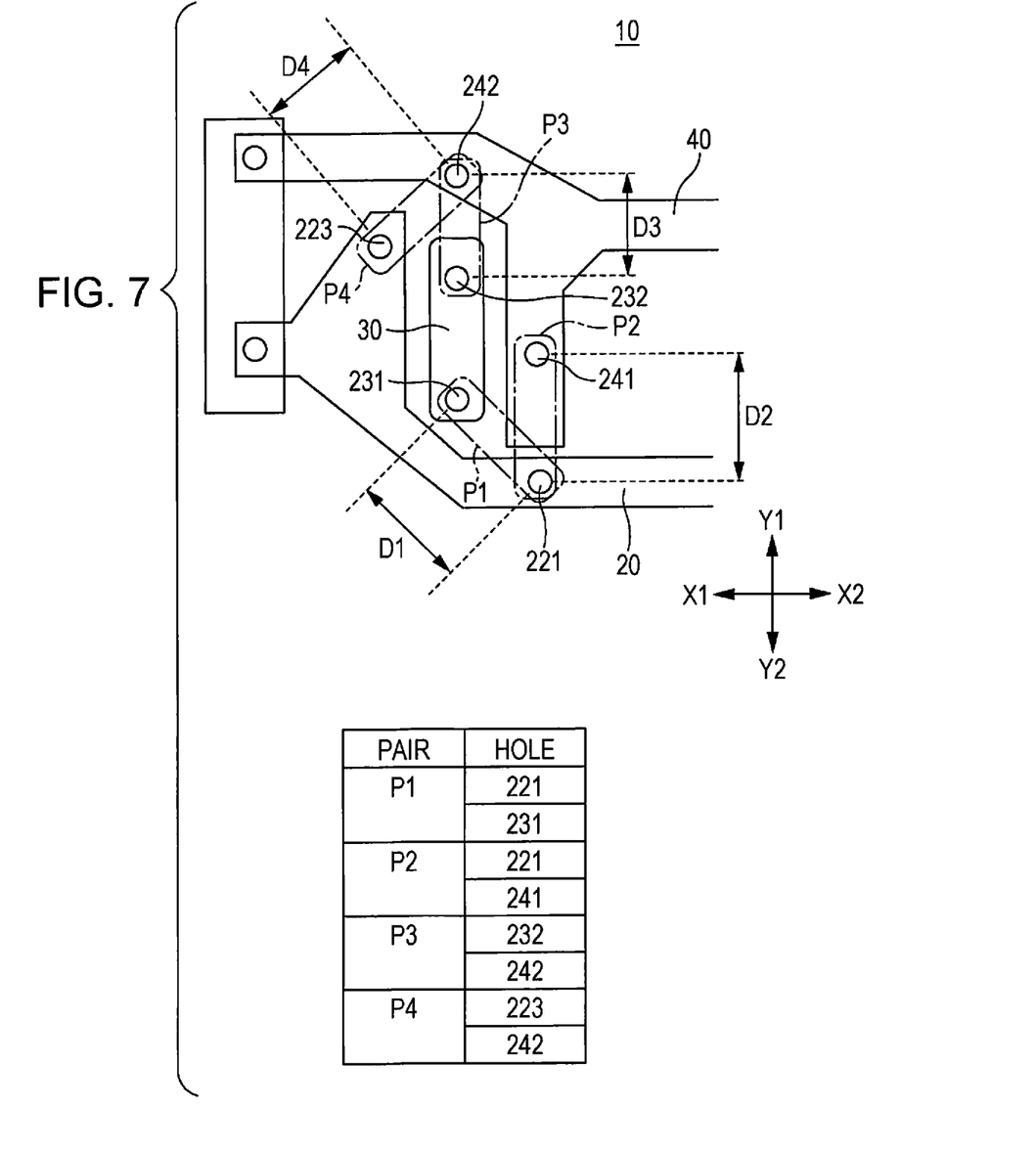
FIG. 7 is a diagram illustrating patterns of a power supply substrate (breakdown voltage setting circuit) according to a third embodiment.

FIG. 7 is a diagram illustrating patterns of a power supply substrate 10 (breakdown voltage setting circuit 13) according to a third embodiment. FIG. 7 illustrates a so-called barebones state, that is, a state where electronic components have been removed from the power supply substrate 10.

In the third embodiment as well, a first pattern 20, a second pattern 30, and a third pattern 40 which constitute a portion of the breakdown voltage setting circuit 13 are also formed on a component placement surface of the power supply substrate 10.

Holes 221 and 223 for extracting a negative voltage are formed on the first pattern 20. That is, in the third embodiment, the number of holes which are formed on the first pattern 20 in order to mount capacitors is less than that in the first embodiment. In FIG. 7, the hole 223 is formed on the third pattern 40 side (Y1 side) of an input side (X1 side) of the first pattern 20, and the hole 221 is formed at a position which is separated on an opposite side (Y2 side) of the hole 223.

Holes 231 and 232 are formed on the second pattern 30. In FIG. 7, the hole 231 of the second pattern 30 is formed on the first pattern 20 side (Y2 side) of the second pattern 30. The hole 232 is formed on the third pattern side (Y1 side) of the second pattern 30.

Holes 241 and 242 for extracting a positive voltage are formed on the third pattern 40. That is, in the third embodiment, the number of holes which are formed on the third pattern 40 in order to mount capacitors is less than that in the first embodiment. In FIG. 7, the hole 241 is formed on the first pattern 20 side (Y2 side) of the output side (X2 side) of the third pattern 40, and the hole 242 is formed at a position which is separated on an opposite side (Y1 side) of the hole 241.

In the third embodiment, a distance D1 between the first pair P1 of holes is equal to a distance D2 between the second pair P2 of holes. A distance D3 between the third pair P3 of holes is equal to a distance D4 between the fourth pair P4 of holes. For this reason, at least a portion of the capacitors 14 and 15 has the same position on the power supply substrate 10 when the capacitors 14 and 15 are mounted by inserting leads of the capacitors 14 and 15 into the first pair P1 of holes and when the capacitors 14 and 15 are mounted by inserting leads of the capacitors 14 and 15 into the second pair P2 of holes.

However, in the third embodiment, the hole 221 is commonly used in the first pair P1 and the second pair P2 and the hole 242 is commonly used in the third pair P3 and the fourth pair P4. As a result, the number of holes which are formed on each pattern is less than that in the first embodiment.

In the above-described third embodiment, the following advantages are obtained in addition to the advantage obtained in the first embodiment. It is possible to reduce the number of holes which are formed on each of the patterns and to easily design or manufacture a power supply substrate.

4. Fourth Embodiment

A pattern shape for reducing the number of holes is not limited to that in the third embodiment.

Figure 8:
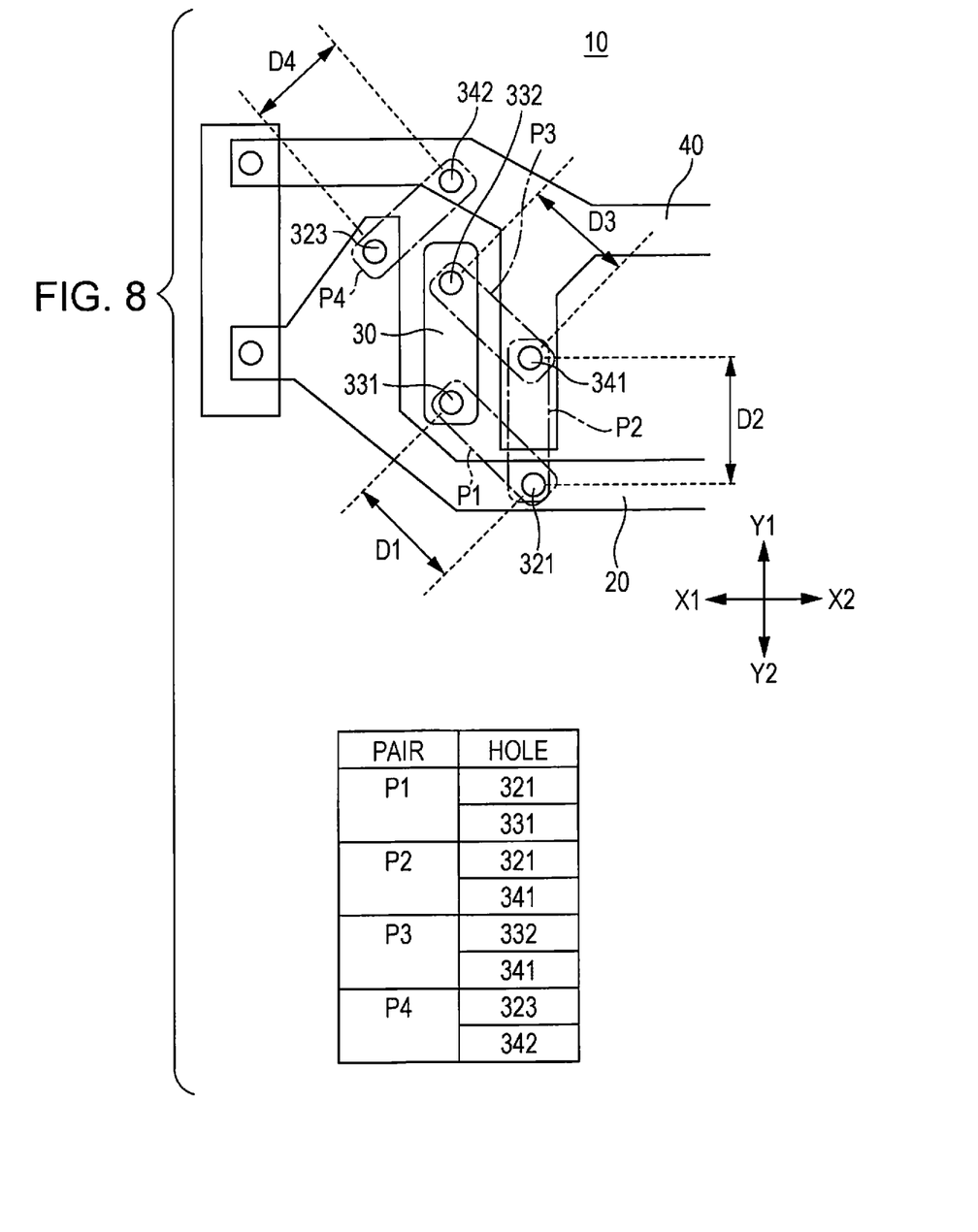
FIG. 8 is a diagram illustrating patterns of a power supply substrate (breakdown voltage setting circuit) according to a fourth embodiment.

FIG. 8 is a diagram illustrating patterns of a power supply substrate 10 (breakdown voltage setting circuit 13) according to a fourth embodiment. In the power supply substrate 10 illustrated in FIG. 8, holes 321 and 323 for extracting a negative voltage are also formed on a first pattern 20. Holes 331 and 332 are formed on a second pattern 30. Holes 341 and 342 for extracting a positive voltage are formed on a third pattern 40.

In the fourth embodiment, a distance D1 between the first pair P1 of holes is equal to a distance D2 between the second pair P2 of holes. A distance D3 between the third pair P3 of holes is equal to a distance D4 between the fourth pair P4 of holes. For this reason, at least a portion of the capacitors 14 and 15 has the same position on the power supply substrate 10 when the capacitors 14 and 15 are mounted by inserting leads of the capacitors 14 and 15 into the first pair P1 of holes and when the capacitors 14 and 15 are mounted by inserting leads of the capacitors 14 and 15 into the second pair P2 of holes.

In the above-described fourth embodiment, advantages similar to those in the third embodiment are obtained.

5. Fifth Embodiment

An electronic component may be mounted on a power supply substrate by using a surface mounting method.

In the surface mounting method, a land is formed on a pattern of a substrate instead of a hole.

The land corresponds to a terminal which is formed on the pattern and is electrically connected to a terminal of an electronic component. In a surface mounting type substrate, the land on the pattern and a terminal of the electronic component are electrically connected by using solder and the like.

Figure 9:
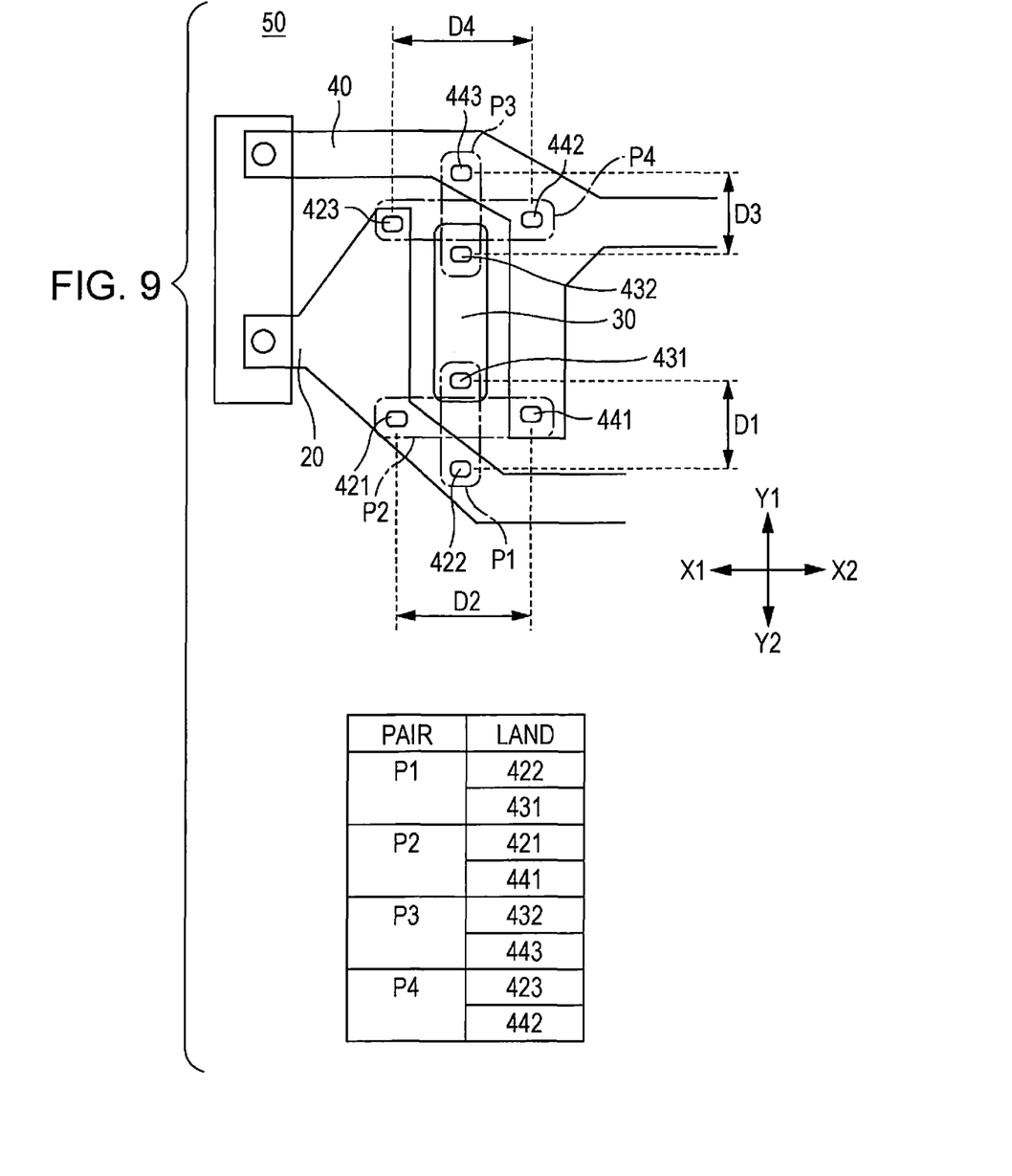
FIG. 9 is a diagram illustrating a configuration of a surface-mounting substrate according to a fifth embodiment.

FIG. 9 is a diagram illustrating a configuration of a surface mounting type substrate (barebones) according to a fifth embodiment. FIG. 9 illustrates a configuration of a substrate 50 when the breakdown voltage setting circuit 13 illustrated in FIG. 2 is formed by using the surface mounting method.

A first pattern 20, a second pattern 30, and a third pattern 40 which constitute a portion of the breakdown voltage setting circuit 13 are formed on a component placement surface of the substrate 50. A land (terminal) is formed on each of the patterns 20, 30, and 40 by using a conductive material such as a copper foil. The substrate 50 illustrated in FIG. 9 is a substrate obtained by changing a through-hole mounting type substrate illustrated in FIG. 3 to a surface mounting type substrate.

For this reason, a surface mounting type electronic component (surface mounting component) is mounted on the substrate 50 by using solder and the like.

In FIG. 9, a first pair P1 is configured by a land 422 of the first pattern 20 and a land 431 of the second pattern 30. A second pair P2 is configured by a land 421 of the first pattern 20 and a land 441 of the third pattern 40. The third pair P3 is configured by a land 443 of the third pattern 40 and a land 432 of the second pattern 30. A fourth pair P4 is configured by a land 442 of the third pattern 40 and a land 423 of the first pattern 20.

A case where a surface mounting type capacitor is mounted on the substrate 50 will be described as an example.

A capacitor is mounted by using the first pair P1 of lands 422 and 431 and the same type of capacitor is mounted by using the third pair P3 of lands 432 and 443. Thus, the two capacitors are connected in series.

A capacitor is mounted by using the second pair P2 of lands 421 and 441 and the same type of capacitor is mounted by using the fourth pair P4 of lands 423 and 442. Thus, the two capacitors are connected in parallel.

In the fifth embodiment, a distance D1 between the lands 422 and 431 is equal to a distance D2 between the lands 421 and 441, and a distance D3 between the lands 432 and 443 is equal to a distance D4 between the lands 423 and 442.

As described above, in the fifth embodiment, the invention may be also applied to a surface mounting type substrate. In the second to the fourth embodiments, the through-hole mounting type substrate is changed to the surface mounting type substrate, and thereby effects similar to those in the example illustrated in FIG. 9 are also obtained.

6. Other Embodiments

The example of using the printer as an electronic device is only an example. As the electronic device, an apparatus including a substrate, for example, a reading apparatus such as a scanner, a combined apparatus, a display apparatus such as a PC, and the like may be used.

As the two electronic components, capacitors having the same capacitance may be used and capacitors having different capacitances may be used.

The example of using the capacitor as the electronic component is only an example. As the electronic component, a component of enabling changing of connection, for example, a resistor, a coil, and the like may be used.

The example of using the breakdown voltage as the specifications of a power supply substrate is only an example. As the specifications of a power supply substrate, any characteristics of a circuit which are changed by changing a connection state of an electronic component may be used.

In the above-described examples, descriptions are made for easy understanding of descriptions on the assumption that wiring shapes on the substrates are the same. However, this case is only an example and a wiring shape may be freely determined in accordance with the entire layout of the substrate, electronic components which will be used, or the like.

The invention is not limited to the above-described examples. The following cases may be disclosed as an example of the invention: combinations are appropriately changed for substituent members and configurations which are disclosed in the examples, and changed combinations are applied; members and configurations which are not disclosed in the above examples, but are known technologies and which are substituted with members and configurations which are disclosed in the above examples are appropriately substituted and combinations of those are changed and applied; and members and configurations which are not disclosed in the above examples, but may be assumed as alternatives of members and configurations which are disclosed in the above examples, based on known technologies by skilled persons in the related art are appropriately substituted and combinations of those are changed and applied.

What is claimed is:

1. A substrate comprising:
    a first pattern which corresponds to wiring on which terminals are formed;
    a second pattern which corresponds to wiring on which terminals are formed; and
    a third pattern which corresponds to wiring on which terminals are formed,
    wherein a distance between a first pair of terminals which are configured by one terminal of the first pattern and one terminal of the second pattern is equal to a distance between a second pair of terminals which are configured by one terminal of the first pattern and one terminal of the third pattern, and
    a distance between a third pair of terminals which are configured by one terminal of the third pattern and one terminal of the second pattern is equal to a distance between a fourth pair of terminals which are configured by one terminal of the third pattern and one terminal of the first pattern.

2. The substrate according to claim 1, wherein
    the first pattern and the third pattern are extended from an input side of the substrate to an output side,
    the second pattern is disposed between the first pattern and the third pattern, a portion of the second pattern at which the terminal of the first pair is formed is extended to a portion side of the first pattern at which the terminal of the first pair is formed, a portion of the third pattern at which the terminal of the second pair is formed is extended to a portion side of the first pattern at which the terminal of the second pair is formed, a portion of the second pattern at which the terminal of the third pair is formed is extended to a portion side of the third pattern at which the terminal of the third pair is formed, and a portion of the first pattern at which the terminal of the fourth pair is formed is extended to a portion side of the third pattern at which the terminal of the second pair is formed.

3. The substrate according to claim 1, wherein the terminal of the first pair and the terminal of the second pair in the first pattern are common terminals, and the terminal of the third pair and the terminal of the fourth pair in the third pattern are common terminals.

4. The substrate according to claim 1, wherein the terminal of the first pair and the terminal of the second pair in the first pattern are common terminals, and the terminal of the second pair and the terminal of the third pair in the third pattern are common terminals.

5. The substrate according to claim 1, wherein a line which links the first pair of terminals to each other is parallel to a line which links the third pair of terminals to each other, a line which links the second pair of terminals to each other is parallel to a line which links the fourth pair of terminals to each other, and the line which links the first pair of terminals to each other is not parallel to the line which links the second pair of terminals to each other.

6. The substrate according to claim 1, wherein at least a portion of an electronic component when the electronic component is mounted by the first pair of terminals has the same position as when the electronic component is mounted by the second pair of terminals, and the first pair of terminals and the second pair of terminals are disposed in an area of the same position on the substrate.

7. The substrate according to claim 6, wherein the first pair of terminals and the second pair of terminals are disposed at positions which causes a point obtained by intersecting the line which links the first pair of terminals to each other and the line which links the second pair of terminals to each other, to be a middle point of the line which links the first pair of terminals to each other and to be a middle point of the line which links the second pair of terminals to each other.

8. An electronic device comprising:

the substrate according to claim 1; and two electronic components of the same type, wherein the electronic components are mounted on the first pair of terminals and the third pair of terminals, or on the second pair of terminals and the fourth pair of terminals.

\* \* \* \* \*